United States Patent [19]

Bonaccio

[11] Patent Number: 5,488,306
[45] Date of Patent: Jan. 30, 1996

[54] OPEN AND SHORT FAULT DETECTOR FOR A DIFFERENTIAL INTERFACE

[75] Inventor: Anthony R. Bonaccio, Shelburne, Vt.

[73] Assignee: International Business Machines Corp., Armonk, N.Y.

[21] Appl. No.: 250,963

[22] Filed: May 31, 1994

[51] Int. Cl.$^6$ ................................................ G01R 31/02
[52] U.S. Cl. .......................... 324/539; 324/540; 324/625; 324/627; 371/25.1; 327/74
[58] Field of Search ..................................... 324/509, 534, 324/539, 540, 541, 647, 625; 327/74; 371/25.1

[56] References Cited

U.S. PATENT DOCUMENTS

| 3,715,667 | 2/1973 | Nicolson | 324/647 |
|---|---|---|---|
| 4,032,766 | 6/1977 | Hughes et al. . | |
| 4,086,570 | 4/1978 | Wakasa et al. . | |
| 4,234,900 | 11/1980 | Miyazaki | 324/509 |
| 4,551,671 | 11/1985 | Annunziata | 324/539 |
| 4,689,551 | 8/1987 | Ryan et al. . | |
| 4,697,099 | 9/1987 | Bonaccio . | |
| 4,748,652 | 5/1988 | Nagal et al. . | |
| 4,782,300 | 11/1988 | Bonaccio et al. . | |
| 4,833,414 | 5/1989 | Heller . | |
| 5,027,074 | 6/1991 | Haferstat . | |
| 5,229,725 | 7/1993 | Spaeder | 324/509 |

Primary Examiner—Kenneth A. Wieder
Assistant Examiner—Jose M. Solis
Attorney, Agent, or Firm—Thornton & Thornton; Lawrence H. Meier

[57] ABSTRACT

An improved cable fault detection system which makes the fault detection independent of the ground shift between units coupled to the interface. This fault detection is based on differentially sensing the voltage on a wire pair, in a cable, and using the differential voltage applied to the wires to make a decision as to whether or not the cable is faulted. The disclosed differential sensing and fault checking scheme reviews both data states thus making the fault detection independent of the ground shift between machines on the interface and this is accomplished without reducing the load impedance presented to the cable by the differential receiver coupled thereto.

9 Claims, 4 Drawing Sheets 5,488,306

OPEN AND SHORT FAULT DETECTOR FOR A DIFFERENTIAL INTERFACE

FIELD OF THE INVENTION

This invention relates generally to differential current-mode interfaces, and, more particularly, to an apparatus and method for automatically detecting, diagnosing, and isolating faults, i.e., either short or open circuits, in the cable used with such interfaces.

BACKGROUND OF THE INVENTION

Differential current-mode interfaces are currently used in computer systems to connect a plurality of storage devices, such as disks and tapes, to an intelligent host interface, such as a storage controller. Such differential current mode interfaces, also known as the Director to Device Connection (DDC) generally include a cable formed of one or more wire pairs each of which runs from the storage controller to a respective storage device, in a "daisy chain" configuration. Each pair of wires, forming the cable, is terminated in its differential, characteristic impedance at both ends. Drivers and receivers used with these interfaces are designed such that the impedance they present to the interface is much higher than that of the termination so that they do not substantially influence the overall interface impedance as seen from any point on the interface.

These interfaces may, in addition to the cable, include card wiring and wiring internal to the machine leading to external connectors and terminator functions within the entire system as well as any wiring interconnecting multiple machines. Any of these wires or components can suffer faults, such as opens or shorts to ground, and those potions outside the machine are particularly subject to such faults due to damage during installation and use. Since these interfaces are differential, they can function nominally even with one of the two wires faulted. However, it is common, under these conditions, for the interface to perform intermittently or at degraded transmission rates due to multiple retries. This impacts the accessibility of the data to the user and can be difficult to diagnose.

Prior art fault detectors, of which U.S. Pat. No. 4,782,300 assigned to the same assignee of the present invention is typical, have two known weaknesses. The first is that they ignore characteristics of the interface such as common-mode voltage shifts and cable resistance and depend to some degree on the processing parameters used to fabricate the transceiver.

More specifically the prior art fault detector, taught in the referenced patent, operates on the principle that the voltage at the biased end of the cable depends strongly on the status of the cable and the terminating resistor at the far end. Unfortunately, for certain values, the voltage at the biased end of any wire in the cable will approximately double if the wire is open regardless of the common-mode voltage. At the same time the absolute voltages for the normal, shorted and open cases are a strong function of the common-mode voltage. The prior art ignored these conditions and thus will, at times, diagnose good lines as defective and defective lines as good.

Other more cumbersome methods to isolate such fault have also been used. One such method requires a repairman manually installing a special DDC wrap plug at various point along the DDC and repeated interaction on the part of the diagnostician with the service panel. This procedure leads to long down times and considerable effort on the part of the diagnostician and thus is not desirable.

Accordingly, there now exists a need for a cable detection system that avoids all the above described problems associated with the detection of opens and shorts in cables used with such differential common-mode interfaces.

SUMMARY OF THE INVENTION

It is therefore an object of the present invention is to provide an improved cable fault detection system which makes the fault detection independent of the ground shift between units coupled to the interface.

It is another object of the present invention to provide a detector which will differentially sense the voltage on a wire pair, in a cable, and uses the differential voltage applied to the wires to make a decision as to whether or not the cable is faulted.

It is still another object of the invention to provide a method and apparatus for the diagnosing of and isolating of defective director to device connection (DDC) faults without manual intervention.

It is a further object of the invention to use a system employing an external component network.

It is still a further object of the invention to provide a fault detection system that will detect and report fault in the cables or their terminations under all conditions that may exist on differential mode interfaces.

These desirable results and other objects and advantages, of the present invention, are realized and provided by, an improved differential sensing and fault checking scheme that reviews both data states thus making the fault detection independent of the ground shift between machines on the interface. This is accomplished without reducing the load impedance presented to the cable by the differential receiver coupled thereto.

The differential sensing scheme of the present invention further uses and requires only an operational amplifier to sense the differential cable voltage.

These and other objects, features, and advantages of the invention will be apparent from the following more particular description of the preferred embodiment of the invention as illustrated in the accompanying drawings.

DESCRIPTION OF THE PREFERRED EMBODIMENT

Figure 1:
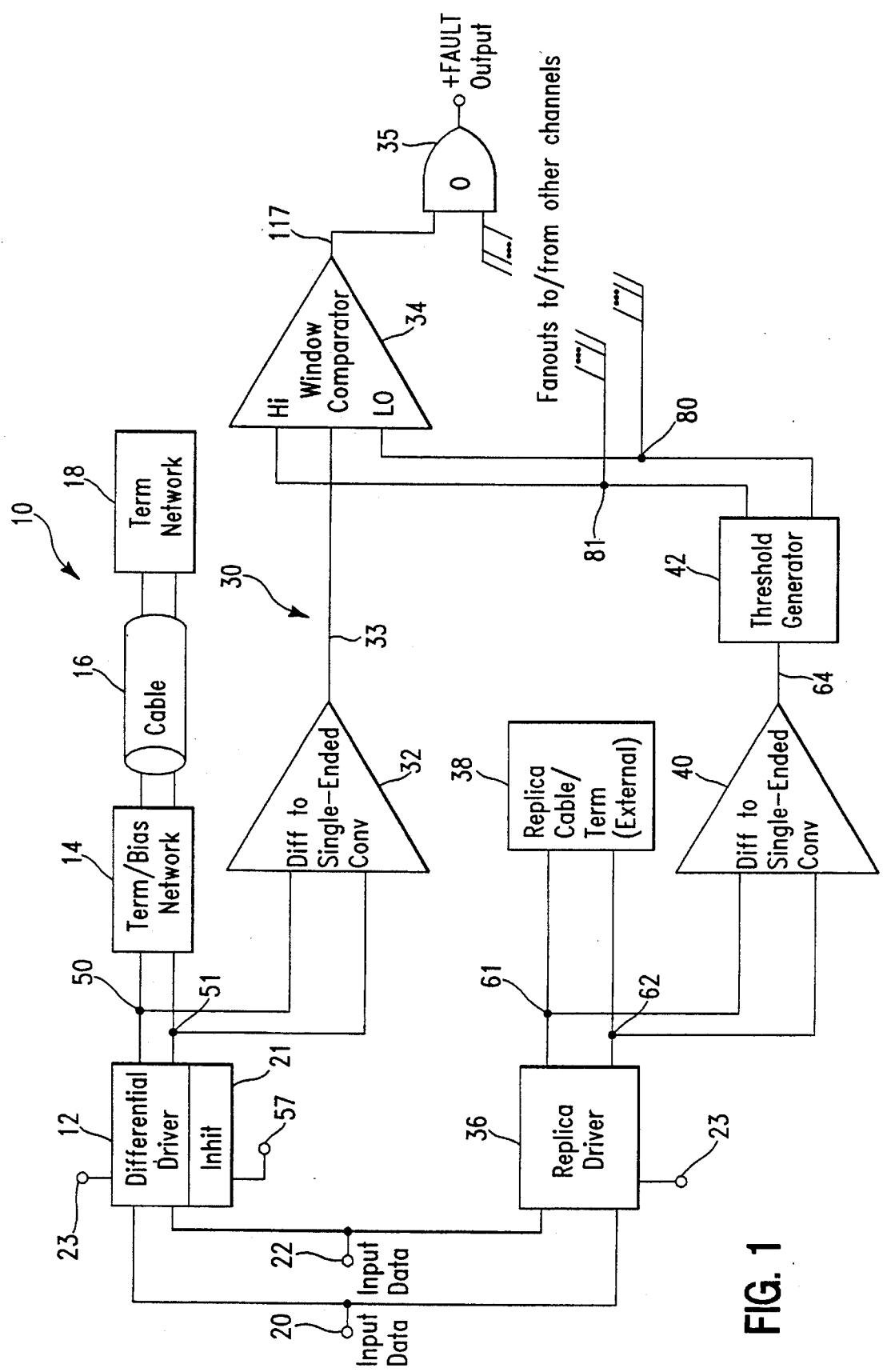
FIG. 1 is a block diagram of the improved fault detection system of the present invention as actually used with a differential mode interface employing a cable.

Basically, the present invention, as will be more fully set forth below, describes an improved, automatic, differential sensing and fault checking method and apparatus for sensing in each wire of a differential pair, in a cable, both data states to make the fault detection independent of the ground shift between machines on the interface and without reducing the load impedance presented to the cable by the differential receiver coupled thereto.

Referring now to the drawing there will be generally described the improved detection system of the invention and its method of operation.

FIG. 1 shows a typical Director to Device Connector (DDC) 10 to which is connected the fault detector 30 of the present invention. The DDC 10 generally comprises a differential driver 12 having differential data input nodes 20 and 22, a current reference input node 23 and outputs 50 and 51. The driver 12 is coupled through output nodes 50 and 51 to a terminating and biasing network 14 fixed at the proximal end of a cable 16, i.e., the end adjacent the driver, and thence through the cable 16 to a terminating network 18 affixed at the distal end of the cable.

Figure 2:
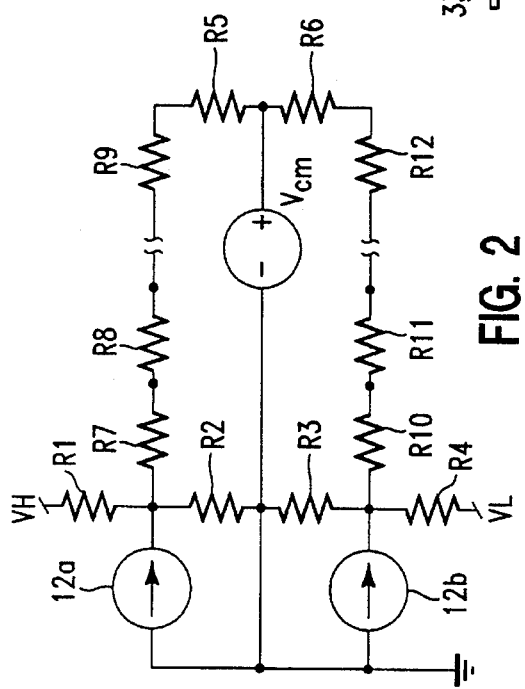
FIG. 2 shows the equivalent circuit for the director to device connector DDC interface which is measured by the present invention.

The equivalent circuit of the DDC 10 is shown in FIG. 2. In this model the differential driver 12 is assumed to be and is represented by ideal current source 12a and ideal current sink 12b, the terminating and biasing network as resistors R1, R2, R3, and R4, the termination network 18 by resistors R5 and R6 and the pair of wires, forming the cable, as resistors R7, R8, R9, R10, R11, and R12. The common-mode voltage source $V_{cm}$ represents the difference in ground potentials, typically ±3 volts.

Figure 3:
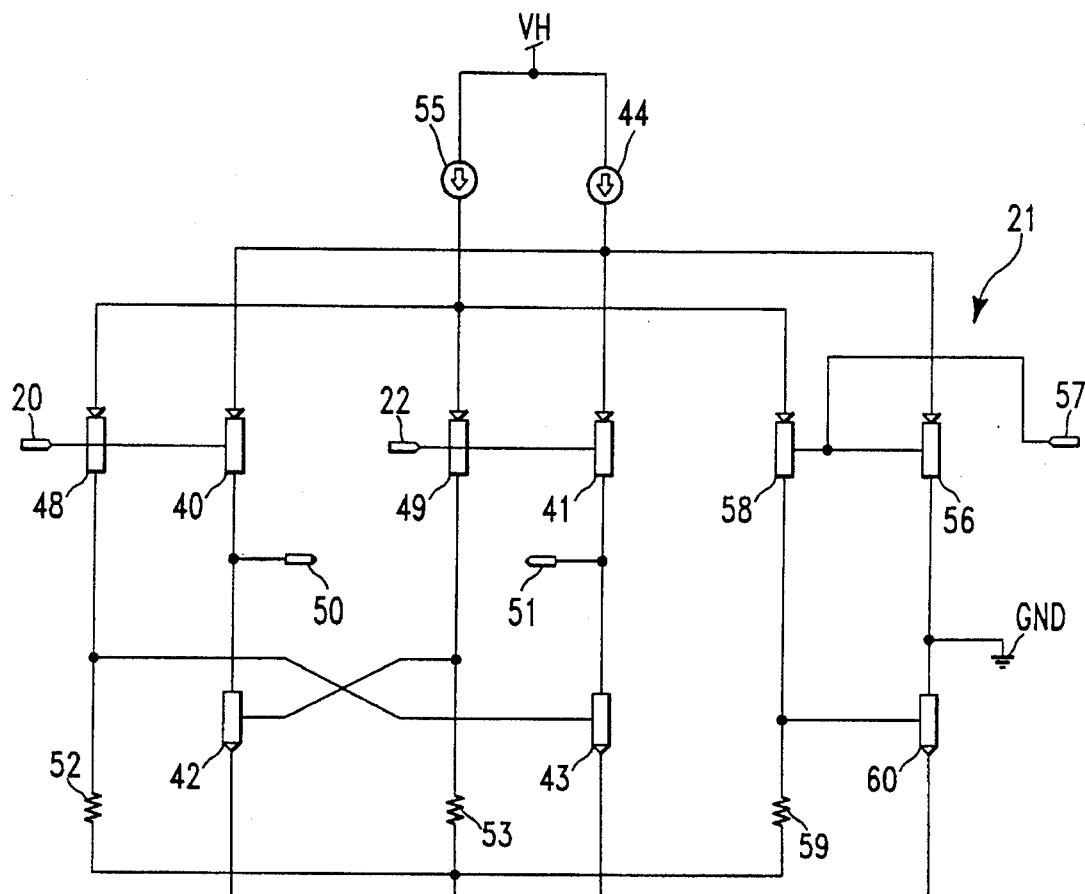
FIG. 3 is a schematic of a differential driver that can be used with the present invention.

The differential driver. 12 is shown in schematic form in FIG. 3 and is basically comprised of four current switches 40, 41, 42, and 43 coupled between a current source 44 and a current sink 45. Current switches 40 and 41 are PNP transistors and current switches 42 and 43 are NPN transistors. PNP transistors 40 and 41 are emitter coupled through current source 44 to voltage source VH with their bases coupled to differential inputs 20 and 22 and the bases of respective emitter coupled PNP auxiliary switching transistors 48 and 49. The collector of transistor 40 is coupled to differential output 50 and through an NPN current switch transistor 42 to current sink 45 and thence to voltage source VL.

Similarly, the collector of transistor 41 is coupled to differential output 51 and through NPN current switch transistor 43 to current sink 45 and voltage supply VL.

The emitters of switching transistors 48 and 49 are coupled through a common auxiliary current source 55 to voltage supply VH. The collectors of switching transistors 48 and 49 are respectively cross-coupled to the bases of the current switch transistors 43 and 42 and further coupled through respective load resistors 52 and 53 through bias supply 54 to voltage supply VL.

An inhibit circuit 21 is coupled to the above described driver circuit and comprises a current switch PNP transistor 56 which has its emitter coupled to current source 44. The base of transistor 56 is further coupled to an inhibit signal input 57 and to the base of a PNP auxiliary switching transistor 58 whose emitter is coupled to the auxiliary bias source 55. The collector of transistor 56 is coupled to ground GND and through an NPN current switching transistor 60 to current sink 45 and the voltage supply VL. The collector of switching transistor 58 is coupled to the base of NPN transistor 60 and through a load resistor 59 to bias source 54.

During operation, data pulses are applied simultaneously to the inputs 20, 22 and 57. Assuming that the data pulse applied to input 20 is low and the data applied to inputs 22 and 57 is high both PNP transistors 40 and 48 are switched on and current flows there through to turn on the cross-coupled NPN transistor 43 which rapidly pulls the output 51 down towards VL.

Simultaneously the high data pulse on inputs 20 and 57 switches off PNP transistors 41, 49, 56 and 58 and the cross-coupled NPN transistor 42 allowing the current flow through transistor 40 to pull the output 50 towards the voltage source VH.

When the driver is to be inhibited, the inputs 20 and 22 are allowed to go high, and the inhibit input 57 is pulled low. This results in transistors 56, 58 and 60 all being turned on such that the source current and the sink current are both shunted directly to ground GND through transistors 56 and 60.

Signals appearing at the driver outputs 50 and 51 are transmitted to the cable 16 via the network 14. If the line is normal and operating perfectly the applied differential voltage at any point along the cable is dependent on the drive current, power supplies and network resistor values but is independent of the common-mode voltage.

This is not true however for a faulted line. For a cable which has a break, i.e., an open circuit, in a wire biased to VH, by the driver 12, the voltage at the input to the line at nodes 50 or 51 is linearly dependent on the common-mode voltage. However, because under certain conditions, there is a point at which the common-mode voltage for both good lines and faulted lines are equal and usually within the ±3 volt range discussed above, such breaks were not always detected with the prior art detectors.

The present invention overcomes this difficulty by checking for normal differential voltages in both data states, since the common-mode voltage at which the normal and faulted differential voltages are equal change significantly between the two states.

The present invention accomplishes this by adding to and across the differential driver input nodes 20 and 22 and output nodes 50 and 51 the fault detector system 30 shown in FIG. 1.

Figure 5:
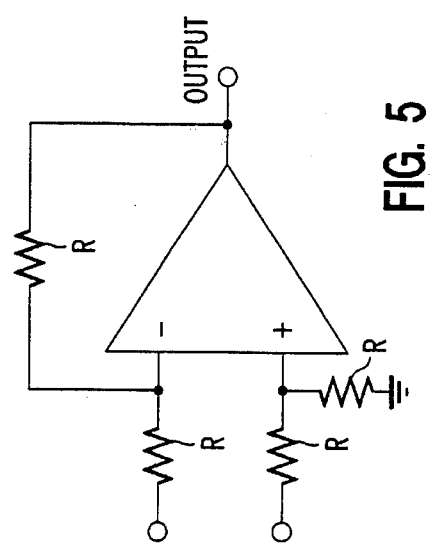
FIG. 5 shows the operational amplifier of FIG. 1 that is coupled to the cable.

This fault detector system 30 of the present invention measures and detects any faults in the cable 16 and as shown in FIG. 1, comprises an operational amplifier circuit 32 whose inputs are coupled to the output nodes 50 and 51 of the driver 12 and hence to the cable 16 to be measured. This operational amplifier 32 is shown, in detail, in FIG. 5 and is a straight forward operational amplifier having its inputs coupled to the nodes 50 and 51 and its output 33 fed to a window comparator circuit 34.

In addition to the operational amplifier circuit 32 and the window comparator circuit 34, a replica driver 36, which may be identical to or a scaled down version of Driver 12, has its inputs in common with the data inputs 20 and 22 and its outputs 61 and 62 coupled to a resistor divider network 38.

Figure 4:
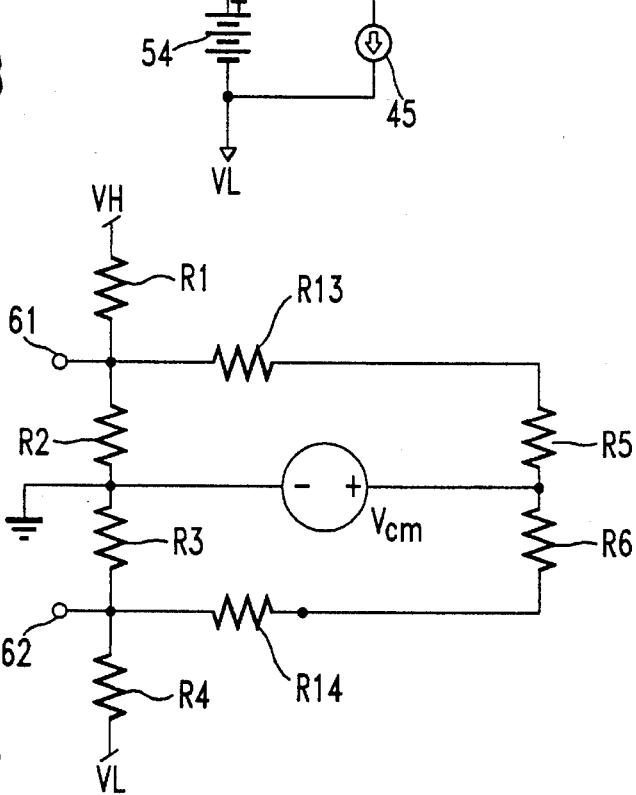
FIG. 4 shows in schematic form the voltage divider network required for measuring the differential device connector.

The replica network 38 is designed to replicate the nominal values of the cable 16 and its associated bias and termination networks 14 and 18 and basically is comprised of a resistor set as shown in FIG. 4 where Resistors R1, R2, R3, and R4 are identical to the biasing and termination network 14 and resistors R5 and R6 are the same as the termination network 18. The resistors R13 and R14 represent an idealized wire pair equal to half the maximum length of the cable 16 and compensates for all resistance such as the parasitic and biasing resistances and the like found in such a cable and the current output of replica driver 36 is designed to be but one eighth (⅛) of the nominal output current of driver 12. Thus these resistors in the network 38 are eight times the values calculated using the nominal terminating, biasing, and parasitic resistance values represented by Resistors R7 trough R12 as shown in FIG. 2.

The outputs 61 and 62 of the replica driver 36 are also coupled to a differential to single-ended convertor 40 and hence through a threshold generator 42, whose function is to generate the upper and lower voltage threshold bounds for an idealized DDC cable equal to half the maximum length of the cable 16, to the window comparator 34 whose output 117 is indicative of a measured fault.

Figure 6:
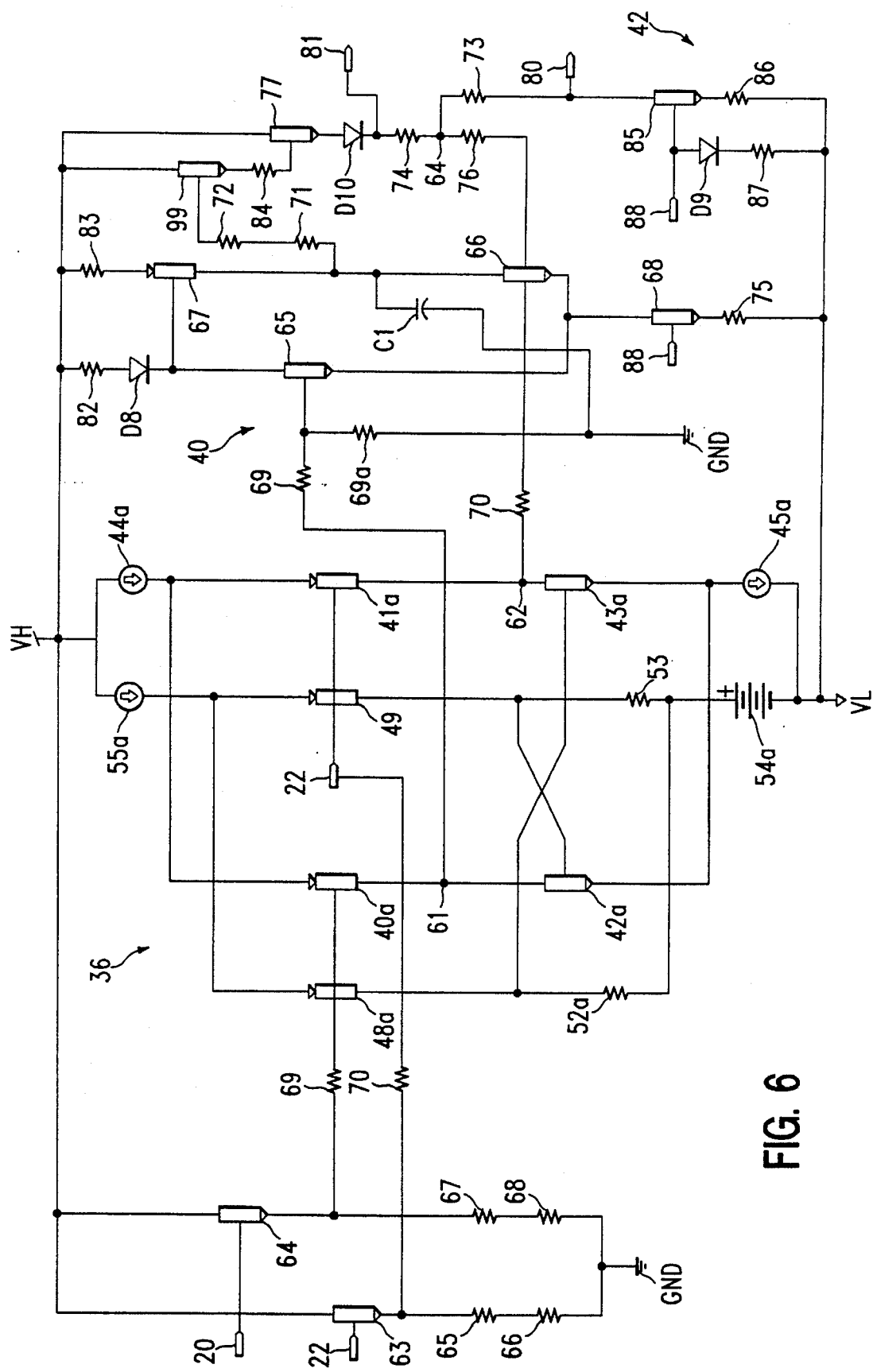
FIG. 6 shows a schematic of the apparatus required for generating selected threshold voltages.

The replica driver 36, the differential to single-ended comparator 40 and the threshold generator 42, are shown in schematic form in FIG. 6. The driver portion of this circuit is substantially similar in form, function and operation to the driver of FIG. 3 but is considered a replica driver or "mini-driver" since it does not include the inhibit circuit 21 and is designed, i.e., scaled down, to draw a current only one eighth (⅛) of the current drawn by the differential driver 12.

Because this replica driver lacks inhibit circuit 21 it is recommended that follower transistors 63 and 64, load resistors 65, 66, 67, and 68 and biasing resistors 69 and 70 be interposed between the differential inputs 20 and 22 and the replica driver current switches 40a, 41a, 42a, and 43a to account for the case when Driver 12 is inhibited and both data inputs 20 and 22 are high. Without these follower transistors and their associated resistors 65 to 70 the replica current source 44a could saturate and affect any common current reference supply and hence the current in other drivers that may also utilize this common current reference supply.

The voltage generated by the replica driver 36 is coupled to outputs 61 and 62 to the replica network 38, as shown in FIG. 1 and the current flow generated therein is sensed at these nodes 61 and 62 differentially with respect to ground GND by the single-ended convertor 40 whose gain is large such that a voltage equal to the difference between driver output nodes 61 and 62, including sign, is produced at its output node 64.

The convertor 40 comprises transistors 65, 66, 67, 68, 77,and 77 as well as diodes D8, D9, and D10 and resistors 69, 69a, 70, 71, 72, 74, 75, 76, 82, 83, 84, and 87, and capacitor C1. As will be apparent to those skilled in the art this comparator circuit is basically an operational amplifier similar to that shown in FIG. 5. Since the use and operation of such operational amplifiers is well known the operation need not be further explained here. It should be noted, however, that the resistors 74 and 76 together comprise the feed back resistor of the operational amplifier. By tapping this feedback resistor to form the resistors 74 and 76 the output transistor 74 also serves as one of the output resistors required by the threshold voltage generator circuit 42, and serves with resistor 73 to generate the voltage threshold outputs 80 (low) and 81 (high).

The threshold generator 42 basically comprises a current mirror formed of transistor 85, diode D9 and resistors 86, and 87 as well as output resistor 73 and the shared output resistor 74 and sets the threshold levels by using an IR drop above (through resistor 74) and below (through resistor 73) the voltage set on node 64 by the convertor 40. This is done by pulling a current proportional to 1/R through resistors 73 and 74. The current drawn through the resistors 73 and 74 can be derived from a reference generator which may be as simple as a bandgap generator and a resistor. This current is supplied to bias current input terminal 88 and mirrored by the current mirror, formed of diode D9, resistors 85 and 86 and transistor 85, into the collector terminal of transistor 85.

The flow of this current through resistors 73 and 74 creates a voltage drop that is insensitive to variations in power supply and temperature, and if created as an integrated circuit is also insensitive to device processing. The current value and the values of the current mirror resistors 86 and 87 are selected to give thresholds that are approximately 125 mV above and below the difference voltage generated at node 64.

Figure 7:
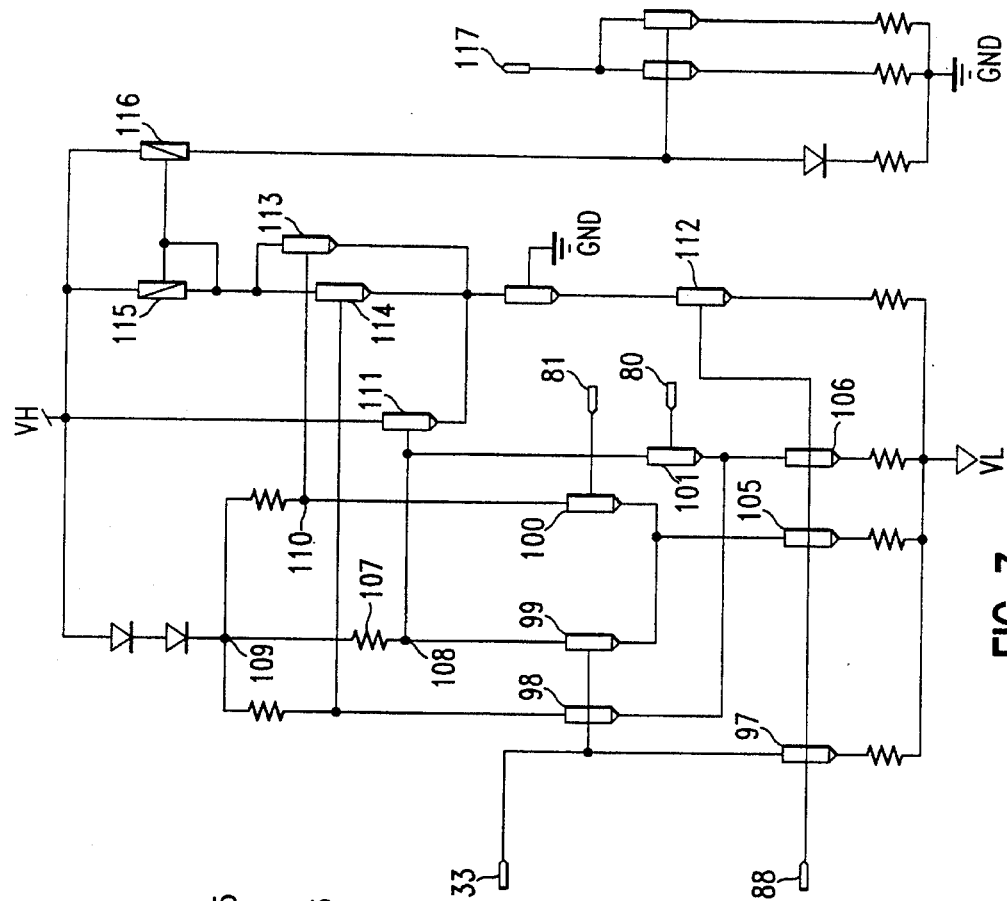
FIG. 7 is a schematic of the window comparator circuit of FIG. 1.

The window comparator 34 is shown in schematic form in FIG. 7 and receives on line 33, the output of the operational amplifier 32 and on the outputs 80 and 81 the threshold levels established by the threshold generator 42. The input 33 is coupled to a current source transistor 97 which must supply a bias sufficient to provide all of the current required by the window comparator circuit 34 when the input differential voltage, across nodes 80 and 81, is at its most negative, while still leaving adequate bias current for the operatioal amplifier 32. The line 33 is also connected to the input of a two-stage NPN comparator that decides whether or not the voltage is in the normal range. The first stage of the comparator, as shown in FIG. 7, comprises transistors 98, 99, 100 and 101 compares the voltage at the input 33 to the references generated on the inputs 80, and 81. If the amplifier output voltage, at node 33, is higher than the voltage appearing on node 81 or lower than that appearing on node 80, the current from source transistors 105 or 106 will be steered into resistor 107. This causes the voltage at node 108 to fall below those at nodes 109 and 110 and keeps transistor 111 in the second stage of the comparator 34 off. Current from second stage bias source transistor 112 then flows in transistors 113 and 114 and the current mirror comprised of P-type FET transistors 115 and 116. This results in a current flow at the output 117 which is used to activate the fault detector output stage 35.

This fault detector output stage is a simple OR gate having a transistor-transistor logic output.

It should be noted that multiple channels can be used and coupled through fanouts connected to nodes 80 and 81 as indicated in FIG. 1 and to the fault detector output stage 35 so that a current from any one of them activates the output fault detector 35.

If the output voltage produced by the threshold generator 42 is between the voltages appearing at nodes 80 and 81, the voltages at nodes 109 and 110 are held below that at node 108. This holds transistors 113 and 114 off and steers all of the current from transistor 112 into the power supply via transistor 111. This results in a nominally zero current flow at the output node 117.

Using only the first stage in the comparator results in unacceptable levels of leakage into output node 117 when there was no fault, especially at high temperature and considering that multiple units are commonly connected at this node. The second stage reduces this effect.

The Reference node 88, applied to the base of transistors 97, 105 and 106 is shut off, i.e.,floated, when the fault detector is inhibited. This results in zero current flow in the both the operational amplifier 32 and the comparator 34. This was done to minimize the reactive load placed on the DDC when the fault detector is inactive.

This completes the description of the preferred embodiment of the invention. Since changes may be made in the above process without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A cable fault detection system in which the detection of faults in a cable is independent of the ground shift comprising:

a cable containing a plurality of wire pairs, each wire pair in said cable including a bias and terminating network and a termination network;

means for applying differential voltages on each such wire pair;

means for sensing the differential voltages applied to each wire pair in said cable;

means for generating a threshold window that defines the acceptable range for the differential voltages applied to each wire pair in said window being independent of any ground shifts in said cable;

means for detecting if said sensed differential voltages on each wire pair in said cable are within or outside said threshold window.

2. A cable fault detection system in which the detection is independent of the ground shift comprising:

means for applying differential voltages to said cable;

means for sensing said differential voltages applied to said cable; and means for generating a threshold window that defines the acceptable range for the differential voltages applied to said cable said threshold window being independent of any ground shifts in said cable;

means for detecting if said sensed differential voltages in said cable are within or outside said threshold window.

3. The system of claim 1 wherein said means for applying said differential voltages includes:

a first driver circuit for applying said differential voltages to each of said wire pairs; and said generating means comprises a second driver for applying differential signals to a known resistance network and applying the output of said network to a threshold generator to create said pre-established threshold voltages, 4. The system of claim 2 wherein said detecting means includes:

a window comparator circuit for comparing said threshold voltages and said sensed voltages and generating an output signal when a difference is found; and a fault sensor coupled to the output of said comparator circuit to indicate a fault in said cable when said output signal is generated by said comparator circuit.

5. The system of claim 3 wherein said first driver further includes an inhibit circuit.

6. The system of claim 3 wherein said resistance network has a resistance value equal to one half the value of the resistance of the wire pairs being measured.

7. The system of claim 1 wherein said bias and termination network is coupled to the proximal end of the cable adjacent the means for differentially applying said differential voltages and the termination network is coupled to the distal end of the cable.

8. The system of claim 2 wherein said generating means comprises:

a driver circuit having differential outputs;

a resistive network, having a resistance value equal to one half the value of the resistance of the cable being measured;

a single ended comparator, having a single output coupled to said differential outputs; and a current mirror coupled to said single output for establishing a pair of threshold voltages at selected outputs.

9. The system of claim 8 wherein there is further provided a window comparator circuit coupled to the output to said means for sensing said differential voltages applied to said cable and to the outputs of said current mirror.

* * * * *